(12) United States Patent
Yoo et al.

(10) Patent No.: US 10,084,079 B2
(45) Date of Patent: Sep. 25, 2018

(54) SEMICONDUCTOR DEVICE HAVING A DRIFT REGION WITH NON-UNIFORM IMPURITY CONCENTRATION PROFILE

(71) Applicant: Samsung Electronics Co., Ltd., Suwon-si, Gyeonggi-do (KR)

(72) Inventors: Jae-Hyun Yoo, Suwon-si (KR); Kwan-Young Kim, Seoul (KR); Jin-Hyun Noh, Seoul (KR); Kee-Moon Chun, Seongnam-si (KR); Yong-Woo Jeon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/052,177

(22) Filed: Feb. 24, 2016

(65) Prior Publication Data
US 2016/0372593 A1    Dec. 22, 2016

(30) Foreign Application Priority Data

Jun. 16, 2015 (KR) .................. 10-2015-0085053

(51) Int. Cl.
*H01L 29/66* (2006.01)
*H01L 29/78* (2006.01)
(Continued)

(52) U.S. Cl.
CPC ...... *H01L 29/7816* (2013.01); *H01L 29/0847* (2013.01); *H01L 29/0878* (2013.01); *H01L 29/66659* (2013.01); *H01L 29/66689* (2013.01); *H01L 29/66795* (2013.01); *H01L 29/7835* (2013.01); *H01L 29/7851* (2013.01); *H01L 29/1095* (2013.01)

(58) Field of Classification Search
CPC ............... H01L 29/086; H01L 29/0878; H01L 29/1083; H01L 29/1095
See application file for complete search history.

(56) References Cited

U.S. PATENT DOCUMENTS 4,794,436 A * 12/1988 Blanchard ........... H01L 29/0615
                                                        257/409
6,903,421 B1 * 6/2005 Huang ................ H01L 29/0634
                                                        257/335
(Continued)

FOREIGN PATENT DOCUMENTS

KR    2011-0037031 A    4/2011
KR    2011-0078621 A    7/2011

*Primary Examiner* — Allen Parker
*Assistant Examiner* — Ismail Muse
(74) *Attorney, Agent, or Firm* — Harness, Dickey & Pierce, P.L.C.

(57) ABSTRACT

A semiconductor device includes a first well disposed in a substrate and including a first impurity of a first conductivity type, a second well disposed in the substrate, including a second impurity of a second conductivity type different from the first conductivity type, and having first to third portions, and a gate structure formed on the first well and the second well, wherein the second portion is disposed between the first portion and the third portion, the first portion and the third portion are formed deeper than the second portion, and concentration of the second impurity of the first portion and the third portion is greater than concentration of the second impurity of the second portion.

12 Claims, 23 Drawing Sheets

(51) Int. Cl.
*H01L 29/08* (2006.01)
*H01L 29/10* (2006.01)

(56) References Cited

U.S. PATENT DOCUMENTS

| | | | |
|---|---|---|---|
| 7,238,986 B2 * | 7/2007 | Pendharkar | H01L 29/0847 |
| | | | 257/327 |
| 7,365,402 B2 | 4/2008 | Ma | |
| 7,898,026 B2 | 3/2011 | Hsieh | |
| 7,915,674 B2 | 3/2011 | Chang et al. | |
| 8,088,656 B2 | 1/2012 | Voldman | |
| 8,212,318 B2 * | 7/2012 | Knaipp | H01L 29/0886 |
| | | | 257/341 |
| 8,314,461 B2 | 11/2012 | Yu et al. | |
| 8,319,283 B2 | 11/2012 | Min et al. | |
| 8,669,614 B2 | 3/2014 | Cheng | |
| 9,520,367 B2 * | 12/2016 | Gao | H01L 23/60 |
| 2001/0000288 A1 * | 4/2001 | Oh | H01L 29/0847 |
| | | | 257/409 |
| 2005/0184338 A1 * | 8/2005 | Huang | H01L 29/0634 |
| | | | 257/335 |
| 2005/0253191 A1 * | 11/2005 | Pendharkar | H01L 29/0847 |
| | | | 257/335 |
| 2006/0027863 A1 * | 2/2006 | Kumagai | H01L 29/0878 |
| | | | 257/335 |
| 2006/0113592 A1 * | 6/2006 | Pendharkar | H01L 29/0847 |
| | | | 257/335 |
| 2006/0244006 A1 * | 11/2006 | Fujihira | H01L 29/0692 |
| | | | 257/127 |
| 2007/0278568 A1 * | 12/2007 | Williams | H01L 21/761 |
| | | | 257/335 |
| 2008/0061367 A1 * | 3/2008 | Williams | H01L 21/761 |
| | | | 257/336 |
| 2010/0035397 A1 * | 2/2010 | Mallikararjunaswamy | H01L 27/115 |
| | | | 438/275 |
| 2011/0079850 A1 * | 4/2011 | Koo | H01L 29/0653 |
| | | | 257/344 |
| 2011/0233673 A1 * | 9/2011 | Liu | H01L 29/0878 |
| | | | 257/343 |
| 2011/0241113 A1 | 10/2011 | Zuniga | |
| 2012/0043581 A1 * | 2/2012 | Koyama | H01L 29/0696 |
| | | | 257/140 |
| 2014/0035033 A1 * | 2/2014 | Lim | H01L 29/7817 |
| | | | 257/338 |
| 2014/0048880 A1 | 2/2014 | Tsuchiko | |
| 2014/0099765 A1 | 4/2014 | Terrill | |
| 2014/0167159 A1 | 6/2014 | Takeda et al. | |
| 2014/0179079 A1 | 6/2014 | Huang et al. | |
| 2014/0206168 A1 | 7/2014 | Yang et al. | |
| 2014/0284716 A1 | 9/2014 | Ren et al. | |
| 2014/0339649 A1 | 11/2014 | Campi, Jr. et al. | |
| 2015/0014771 A1 | 1/2015 | Brochu, Jr. et al. | |
| 2015/0035053 A1 | 2/2015 | Singh | |
| 2016/0056114 A1 * | 2/2016 | Gao | H01L 23/60 |
| | | | 257/340 |
| 2016/0141369 A1 * | 5/2016 | Kim | H01L 29/7816 |
| | | | 257/655 |
| 2016/0276019 A9 * | 9/2016 | Lin | G11C 8/16 |
| 2016/0293758 A1 * | 10/2016 | Kim | H01L 29/7832 |
| 2016/0351590 A1 * | 12/2016 | Cheng | H01L 27/1211 |

* cited by examiner

1200

1300

1400

SEMICONDUCTOR DEVICE HAVING A DRIFT REGION WITH NON-UNIFORM IMPURITY CONCENTRATION PROFILE

CROSS-REFERENCE TO RELATED APPLICATION

This application claims priority from Korean Patent Application No. 10-2015-0085053 filed on Jun. 16, 2015 in the Korean Intellectual Property Office, and all the benefits accruing therefrom under 35 U.S.C. 119, the contents of which in its entirety are herein incorporated by reference.

BACKGROUND

1. Technical Field

The present inventive concepts relate to a semiconductor device and a method of fabricating the same.

2. Description of the Related Art

Recent semiconductor devices have been developed in a direction in which high-speed operation can be performed at a low voltage, and the fabricating processes of the semiconductor devices have been developed in a direction in which a degree of integration is improved.

The improved degree of integration of the devices may cause a short channel effect in a field effect transistor (FET) that is one of the semiconductor devices. Therefore, in order to overcome this, research on a fin field effect transistor (FinFET), in which channels are formed by a three-dimensional space structure, is actively conducted.

SUMMARY

Aspects of the present inventive concepts provide a semiconductor device that has resistance optimized for a logic element by reducing an impurity concentration of a drift region, while providing an LDMOS element used for high voltage.

Aspects of the present inventive concepts also provide a method of fabricating a semiconductor device that has resistance optimized for a logic element by reducing an impurity concentration of a drift region, while providing an LDMOS element used for high voltage.

However, aspects of the present inventive concepts are not restricted to those set forth herein. Other technical problems that have not been mentioned will be clearly understood by a person skilled in the art from the following description.

According to some example embodiments of the present inventive concepts, there is provided a semiconductor device including a first well that is formed within a substrate and includes a first impurity of a first conductivity type, a second well that is formed within the substrate, includes a second impurity of a second conductivity type different from the first conductivity type, and has first to third portions, and a gate structure that is formed on the first well and the second well, wherein the second portion is disposed between the first portion and the third portion, the first portion and the third portion are formed deeper than the second portion, and concentration of the second impurity of the first portion and the third portion is higher than concentration of the second impurity of the second portion.

According to some example embodiments of the present inventive concepts, there is provided a semiconductor device including a first well that is formed within a substrate and includes a first impurity of a first conductivity type, a second well that is formed within the substrate, includes a second impurity of a second conductivity type different from the first conductivity type, and has first and second portions having the second impurity concentrations different from each other, a third well that is formed within the first well and includes the second impurity, a fourth well that is formed within the second well and includes the second impurity, a fifth well that is formed within the second well, includes the first impurity, and is disposed so as to be spaced apart from the fourth well, and a gate structure formed between the third well and the fourth well on the substrate, wherein the fifth well is disposed closer to the gate structure than the fourth well.

According to some example embodiments of the present inventive concepts, there is provided a semiconductor device including a first well that is formed within a substrate and includes a first impurity of a first conductivity type, a second well that is formed within the substrate, includes a second impurity of a second conductivity type different from the first conductivity type, and has first and second portions having the second impurity concentrations different from each other, a third well that is formed within the first well and includes the second impurity, a fourth well that is disposed within the second portion and includes the second impurity, and a gate structure formed on the first well and the second well, wherein the concentration of the second impurity of the first portion is higher than the concentration of the second impurity of the second portion, and the first portion is formed deeper than the second portion.

BRIEF DESCRIPTION OF THE DRAWINGS

The above and other aspects and features of the present inventive concepts will become more apparent by describing in detail example embodiments thereof with reference to the attached drawings, in which.

DETAILED DESCRIPTION OF EXAMPLE EMBODIMENTS

Figure 1:
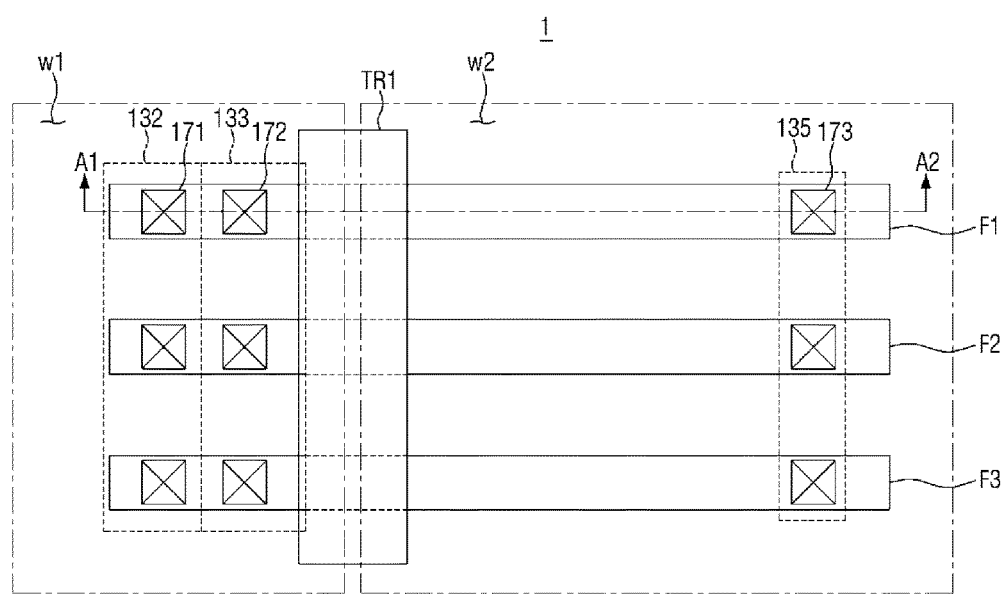
FIG. 1 is a layout diagram for explaining a semiconductor device according to an example embodiment of the present inventive concepts.

The present invention will now be described more fully hereinafter with reference to the accompanying drawings, in which example embodiments of the invention are shown. This invention may, however, be embodied in different forms and should not be construed as limited to the example embodiments set forth herein. Rather, these example embodiments are provided so that this disclosure will be thorough and complete, and will filly convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or example terms provided herein is intended merely to better illuminate the invention and is not a limitation on the scope of the invention unless otherwise specified. Further, unless defined otherwise, all terms defined in generally used dictionaries may not be overly interpreted.

The present invention will be described with reference to perspective views, cross-sectional views, and/or plan views, in which example embodiments of the invention are shown. Thus, the profile of an example view may be modified according to manufacturing techniques and/or allowances. That is, the example embodiments of the invention are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

Advantages and features of the present inventive concepts and methods of accomplishing the same may be understood more readily by reference to the following detailed description of example embodiments and the accompanying drawings. The present inventive concepts may, however, be embodied in many different forms and should not be construed as being limited to the example embodiments set forth herein. Rather, these example embodiments are provided so that this disclosure will be thorough and complete and will fully convey the concept of the inventive concepts to those skilled in the art, and the present inventive concepts will only be defined by the appended claims. In the drawings, the thickness of layers and regions are exaggerated for clarity.

In general, there is a need to use high-voltage elements in a FinFET process. According to such a request, there is a need for development of a LDMOS/DEMOS element that is utilized for high voltage. However, in the FinFET process, a gate of 3D structure is formed due to the process characteristics and a high well doping is used. Thus, there is a limitation on the characteristics of the LDMOS/DEMOS element.

In an example embodiment according to the technical concept of the present inventive concepts, such problems are solved, and a structure of a high-voltage LDMOS/DEMOS element in the FinFET structure is provided. Specifically, a well, which forms a drift within a drift region in a conventional LDMOS/DEMOS element structure, is formed by being patterned, and the well is annealed to form well regions having the impurity concentrations different from each other. By forming an impurity region due to diffusion between the well region and the well region by annealing, it is possible to form a well region in which the impurity concentration is relatively lower than the periphery. This can be utilized to use a semiconductor device having a low concentration well region optimized for the logic element.

Furthermore, in an example embodiment according to the technical ideas of the present inventive concepts, there is provided a structure capable of compensating for low drift resistance, by forming a lightly doped drain (LDD) region at an intersection point between a gate region and a drift region. In particular, it is possible to compensate for the low drift resistance by forming an N-type LDD region.

Furthermore, in an example embodiment according to the technical ideas of the present inventive concepts, it is possible to deeply form a current path, by forming a P-type LDD region at an intersection point between the gate region and the drift region. Such structures may be used by being modified to have appropriate BVdss/Ion characteristics.

A semiconductor device according to some example embodiments of the present inventive concepts will be described below with reference to FIGS. 1 to 10.

Figure 2:
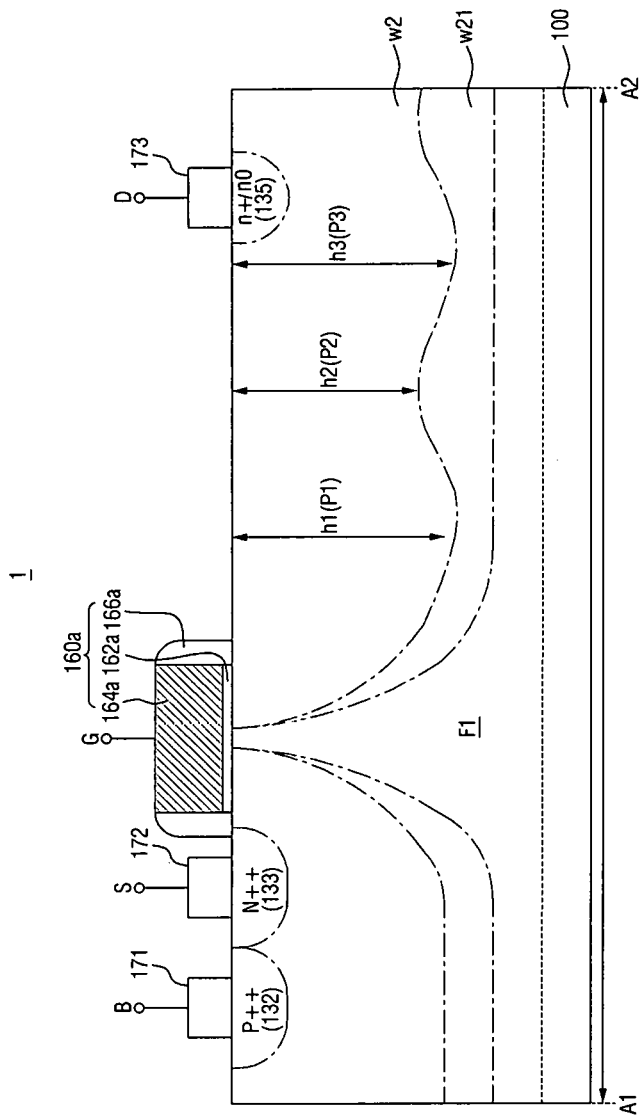
FIG. 2 is a cross-sectional view taken along the line A1-A2 of FIG. 1.
Figure 3:
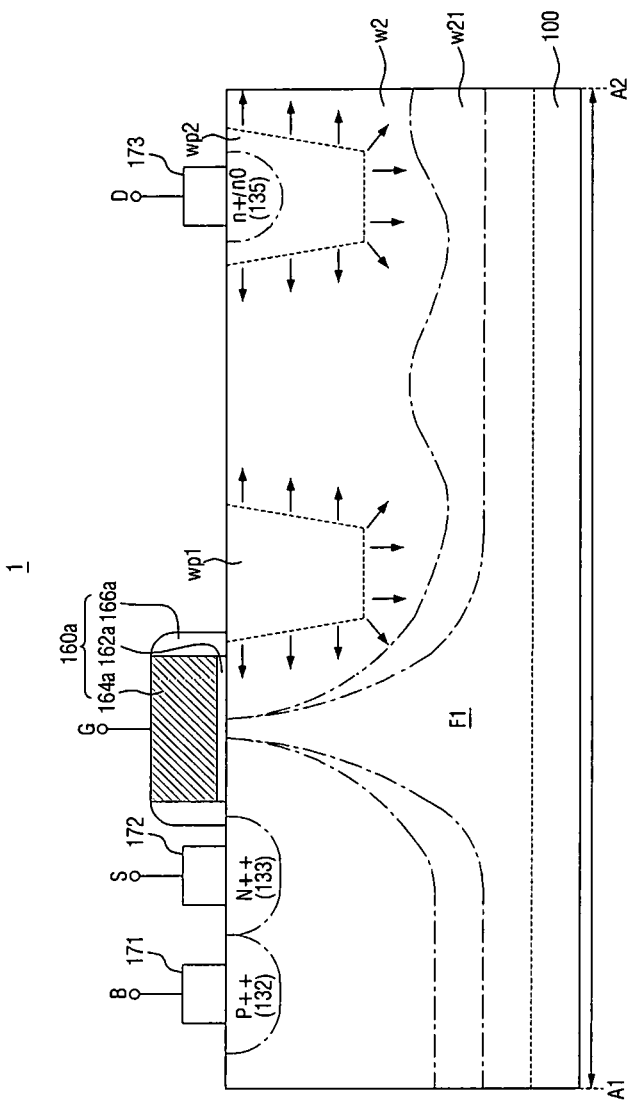
FIG. 3 is a diagram for illustrating a heat treatment process for fabricating the semiconductor device according to an example embodiment of the present inventive concepts.

FIG. 1 is a layout diagram for explaining a semiconductor device according to an example embodiment of the present inventive concepts. FIG. 2 is a cross-sectional view taken along the line A1-A2 of FIG. 1. FIG. 3 is a diagram for illustrating a heat treatment process for fabricating the semiconductor device according to an example embodiment of the present inventive concepts.

Referring to FIGS. 1 to 3, a semiconductor device 1 according to an example embodiment of the present inventive concepts includes a substrate 100, first to third fins F1, F2, F3, a first well W1, a second well W2, a third well 133, a fourth well 135, a fifth well 132, a gate structure 160a, a first electrode 173, a second electrode 172 and a third electrode 171.

The substrate 100, for example, may be bulk silicon or silicon-on-insulator (SOI). Alternatively, the substrate 100 may also be a silicon substrate and may contain other materials, for example, silicon germanium, indium antimonide, lead telluride, indium arsenide, indium phosphide, gallium arsenide or gallium antimonide.

Otherwise, the substrate 100 may be obtained by forming an epitaxial layer on a base substrate. In this case, the epitaxial layer may contain silicon or germanium as an elemental semiconductor material. Moreover, the epitaxial layer may include a compound semiconductor, and for example, may include a group IV-IV compound semiconductor or a group III-V compound semiconductor.

Specifically, taking the group IV-IV compound semiconductor as an example, the epitaxial layer may be a binary compound or a ternary compound containing at least two or more of carbon (C) silicon (Si), germanium (Ge) and tin (Sn) or a compound obtained by doping these elements with the group IV element.

Taking the group III-V compound semiconductor as an example, the epitaxial layer may be one of a binary compound, a ternary compound or a quaternary compound formed by binding at least one of aluminum (Al), gallium (Ga) and indium (In) as the group III element to one of phosphide (P), arsenic (As) and antimonium (Sb) as the group V element.

In this example embodiment, as illustrated, the substrate 100, for example, may be a P-type substrate, but the present inventive concepts are not limited thereto.

The first to third fins F1, F2, F3 protrude from the substrate 100, respectively. The first fin F1 may be doped with impurities so as to include a first well W1, a second well W2, a third well 133, a fourth well 135 and a fifth well 132 which will described below. Also, element isolation films may be further formed on the side surfaces of the first fin F1 to separate the first to third fins F1, F2, F3 from one another. The second fin F2 and the third fin F3 are substantially identical to the description of the first fin F1.

The first well W1 may be formed within the substrate 100. The first well W1 may be formed in a part of the interior of the substrate 100, as illustrated.

Conductivity type of the first well W1, for example, may be the same as that of the substrate 100. That is, when the conductivity type of the substrate 100 is a P-type, the conductivity type of the first well W1 may be a P-type. However, the present inventive concepts are not limited thereto, and the conductivity types of the substrate 100 and the first well W1 may be freely modified.

In addition, the first well W1 may be formed within a first deep well W11. The first deep well W11 may have the same conductivity type as that of the first well W1. However, the doping concentration of the first deep well W11 may be greater than that of the first well W1.

The second well W2 may be formed within the substrate 100. The second well W2 may be formed in a part of the interior of the substrate 100 as illustrated. That is, the second well W2 may be formed in a portion in which the first well W1 is not formed.

The conductivity type of the second well W2, for example, may be different from that of the substrate 100. That is, when the conductivity type of the substrate 100 is a P-type, the conductivity type of the second well W2 may be an N-type. However, the present inventive concepts are not limited thereto, and the conductivity types of the substrate 100 and the second well W2 may be freely modified.

In addition, the second well W2 may be formed within a second deep well W21. The second deep well W21 may have the same conductivity type as that of the second well W2. However, the doping concentration of the second deep well W21 may be greater than that of the second well W2.

The second well W2 may include a first portion P1, a second portion P2 and a third portion P3. At this time, the second portion P2 may be disposed between the first portion P1 and the third portion P3, the first portion P1 and the third portion P3 may be formed deeper than the second portion P2, and the impurity concentrations of the first portion P1 and the third portion P3 may be greater than the impurity concentration of the second portion P2.

Specifically, referring to FIG. 3, after the first well pattern WP1 and the second well pattern WP2 are formed by doping, impurities contained in the first well pattern WP1 and the second well pattern WP2 are diffused by the annealing process thereby to form the second well W2. Thus, the impurity concentration of the second portion P2 may be relatively lower than the first portion P1 and the third portion P3. Further, since the impurity diffusion in a downward direction also occurs in the first portion P1 and the third portion P3, a depth h1 of the first portion P1 and a depth h3 of the third portion P3 may be relatively deeper than other portions. As the impurity diffusion in the downward direction occurs in the first portion P1 and the third portion P3, the impurity concentration may decrease in the depth direction.

By forming the second well W2 having a low impurity concentration (in particular, the second portion P2 has a low impurity concentration), it is possible to fabricate a semiconductor device 1 having a low drift resistance.

A gate structure 160a may be formed on the first well W1 and the second well W2. That is, the gate structure 160a may be formed to overlap the first well W1 and the second well W2. The gate structure 160a may include a gate insulating film 162a, a gate electrode 164a and a spacer 166a.

Specifically, the gate insulating film 162a may be disposed between the substrate 100 and the gate electrode 164a. The gate insulating film 162a may include a high dielectric constant (high-K) film. When the gate insulating film 162a is a high dielectric constant film, the gate insulating film 162a may be formed of a material having a high dielectric constant. In some example embodiments of the present inventive concepts, as the material having the high dielectric constant, for example, $HfO_2$, $Al_2O_3$, $ZrO_2$, $TaO_2$ and the like are adopted, but the present inventive concepts are not limited thereto.

Although it is not illustrated in detailed, an interface film that serves to reduce or prevent the defective interface between the gate insulating film 162a and the substrate 100 may be further disposed between the gate insulating film 162a and the substrate 100. The interface film may include a low dielectric material layer having a dielectric constant (k) of 9 or less, for example, a silicon oxide film (k is about 4) or a silicon oxynitride film (k is about 4 to 8 depending on the content of oxygen atom and nitrogen atom). Otherwise, the interface film (not illustrated) may be formed of silicate or may be formed of a combination of the above-mentioned films.

The gate electrode 164a may include a conductive material. In some example embodiments of the present inventive concepts, the gate electrode 164a may include a metal having high conductivity, but the present inventive concepts are not limited thereto. That is, in some other example embodiments of the present inventive concepts, the gate electrode 164a may be formed of a non-metal such as polysilicon. For example, the gate electrode 164a may be made of Si, SiGe or the like rather than a metal. The gate electrode 164a, for example, may be formed through a replacement process, but is not limited thereto.

The spacer 166a may be disposed on at least one side of the gate electrode 164a. Specifically, as illustrated in FIG. 2, the spacer 166a may be disposed on opposite sides of the gate electrode 164a. The spacer 166a may include at least one of a nitride film and an oxynitride film. In FIG. 2, one side surface of the spacer 166a is illustrated by a curve, but the present inventive concepts are not limited thereto. The shape of the spacer 166a may be freely modified. For example, in some example embodiments of the present inventive concepts, the shape of the spacer 166a may be modified to an I-shape, an L-shape or the like, unlike the illustrated shape.

The third well 133 may be located on one side of the gate structure 160a and may be formed within the first well W1. The third well 133 may have a conductivity type different from that of the first well W1. For example, when the conductivity type of the first well W1 is a P-type, the conductivity type of the third well 133 may be an N-type. However, the present inventive concepts are not limited thereto.

During operation of the semiconductor device according to this example embodiment, the third well 133, for example, may be used as a drain region. However, the present inventive concepts are not limited thereto.

The fourth well 135 may be located on the other side of the gate structure 160a and may be formed within the second well W2. The fourth well 135 may have the same conductivity type as that of the second well W1. For example, when the conductivity type of the second well W2 is an N-type, the conductive type of the fourth well 135 may be an N-type. However, the present inventive concepts are not limited thereto.

The conductivity type of the fourth well 135 may be the same as that of the third well 133. For example, when the conductivity type of the third well 133 is an N-type, the conductive type of the fourth well 135 may be an N-type. However, the concentration of impurities contained in the fourth well 135 may be greater than the concentration of impurities contained in the third well 133. During operation of the semiconductor device according to this example embodiment, the fourth well 135, for example, may be used as a source region. However, the present inventive concepts are not limited thereto.

The second electrode 172 may be disposed on the third well 133, and the second electrode 172 may be electrically connected to the third well 133. For example, the second electrode 172 may be connected to a drain terminal. However, the present inventive concepts are not limited thereto.

The first electrode 173 may be disposed on the fourth well 135, and the first electrode 173 may be electrically connected to the fourth well 135. For example, the first electrode 173 may be connected to a source terminal. However, the present inventive concepts are not limited thereto.

The fifth well 132 may be formed within the first well W1. Specifically, the fifth well 132 may overlap a part of the upper portion of the first well W1. The fifth well 132 may be disposed on one side of the gate structure 160a. That is, the fifth well 132 and the third well 133 may be located on the same side of the gate structure 160a.

The fifth well 132 may have the same conductivity type as that of the first well W1. For example, when the conductivity type of the first well W1 is a P-type, the conductivity type of the fifth well 132 may be a P-type. However, the present inventive concepts are not limited thereto.

The third electrode 171 may be disposed on the fifth well 132, and the third electrode 171 may be electrically connected to the fifth well 132. For example, the third electrode 171 may be connected to a ground terminal. However, the present inventive concepts are not limited thereto.

An element isolation film may be further formed on the side portion of the fifth well 132. For example, the element isolation film may be formed by a shallow trench isolation (STI) structure that is advantageous for high integration due to excellent element isolation characteristics and a small occupied area, but is not limited thereto. The element isolation film, for example, may include at least one of silicon oxide, silicon nitride, silicon oxynitride and combinations thereof. A cross-sectional shape of the element isolation film may be formed in a tapered form, but the present inventive concepts are not limited thereto. That is, the cross-sectional shape of the element isolation film may be freely modified as required.

Figure 4:
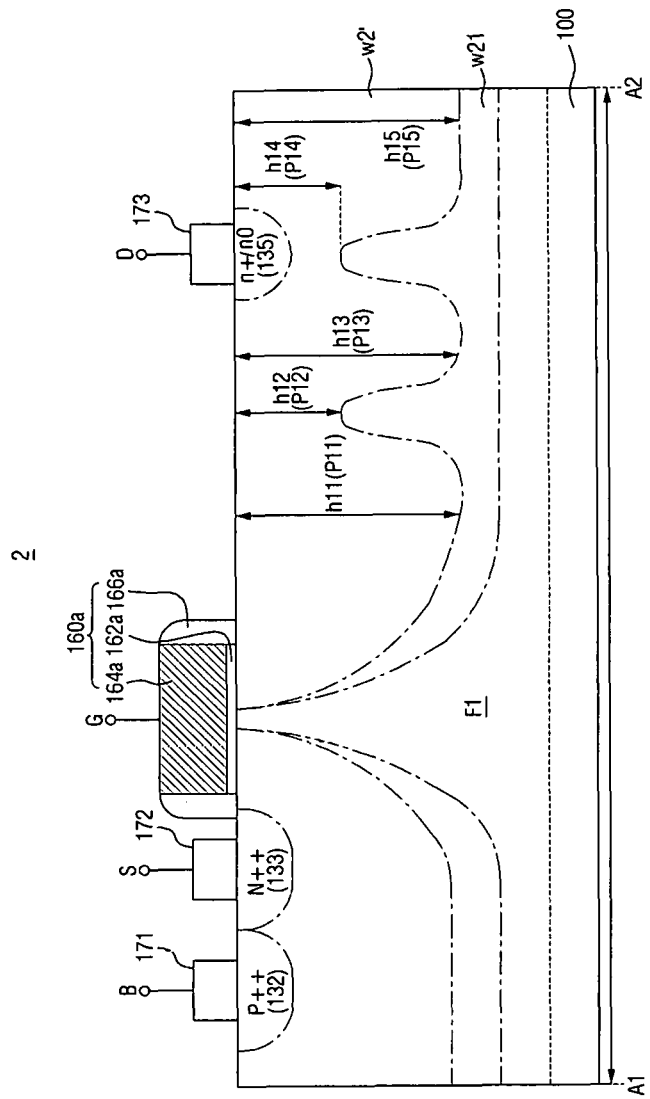
FIG. 4 is a cross-sectional view for explaining a semiconductor device according to an example embodiment of the present inventive concepts.
Figure 5:
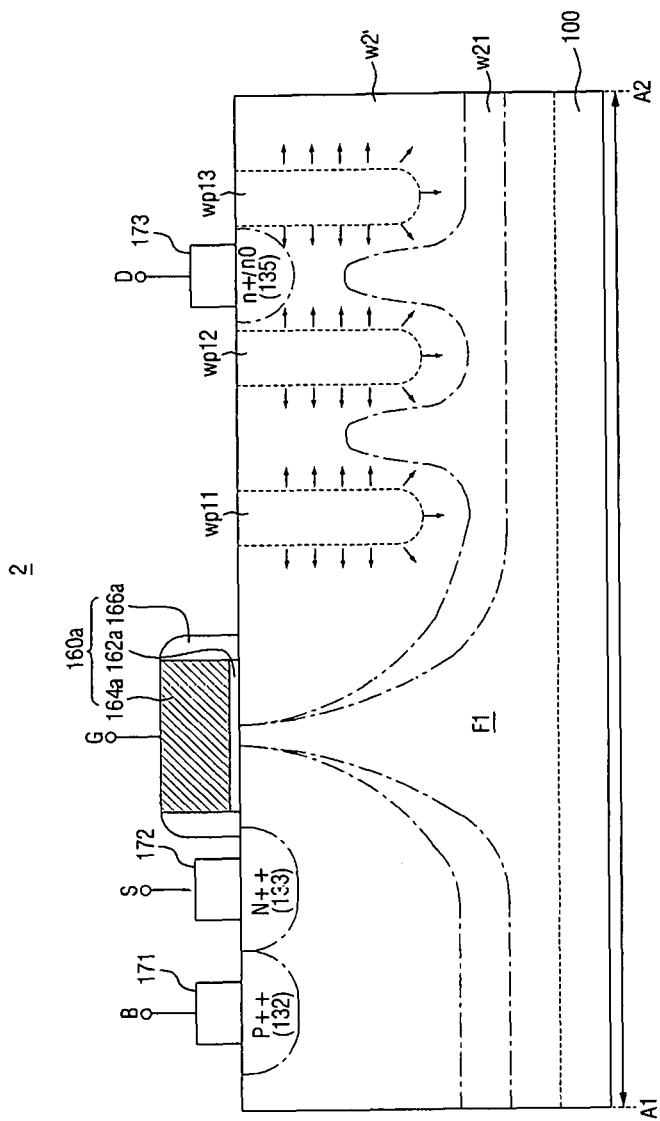
FIG. 5 is a diagram for illustrating a heat treatment process for fabricating the semiconductor device according to an example embodiment of the present inventive concepts.

FIG. 4 is a cross-sectional view for explaining a semiconductor device according to an example embodiment of the present inventive concepts. FIG. 5 is a diagram for illustrating a heat treatment process for fabricating a semiconductor device according to an example embodiment of the present inventive concepts. For convenience of explanation, the description of the parts substantially identical to the semiconductor device in FIGS. 1 through 3 according to an example embodiment of the present inventive concepts will not be provided.

Referring to FIG. 4, a semiconductor device 22 according to an example embodiment of the present inventive concepts may be formed and operated substantially in the same manner as the semiconductor device 1 according to an example embodiment of the present inventive concepts described above with reference to FIG. 2.

However, in the semiconductor device 2 according to an example embodiment of the present inventive concepts, a second well W2' includes first to fifth portions P11, P12, P13, P14, P15.

Specifically, referring to FIG. 5, after forming a first well pattern WP11, a second well pattern WP12 and a third well pattern WP13 by doping, impurities contained in the first well pattern WP11, the second well pattern WP12 and the third well pattern WP13 are diffused by the annealing process thereby to form the second well W2'. Thus, the impurity concentration of the second portion P12 and the fourth portion P14 may be relatively lower than the first portion P11, the third portion P13 and the fifth portion P15. Further, the impurity diffusion in a downward direction also occurs in the first portion P11, the third portion P13 and the fifth portion P15. Thus, the depth h11 of the first portion P11, the depth h13 of the third portion P13 and the depth h15 of the fifth portion P15 may be relatively deeper than other portions. As the impurity diffusion in the downward direction occurs in the first portion P11, the third portion P13 and the fifth portion P15, the impurity concentration may decrease in the depth direction.

At this time, by forming the fourth well 135 on the fourth part P14 (i.e., the fourth well 135 is formed in a region having a low impurity concentration), when it is necessary to adjust the drift resistance as required, it is possible to utilize the structure according to the semiconductor device 2.

Figure 6:
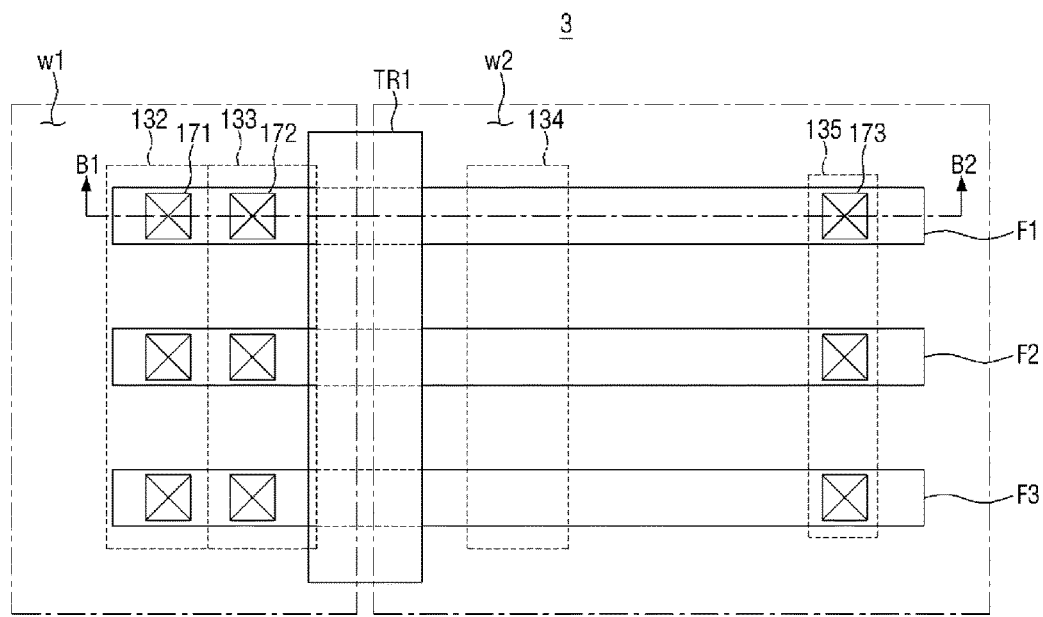
FIG. 6 is a layout diagram for explaining a semiconductor device according to an example embodiment of the present inventive concepts.
Figure 7:
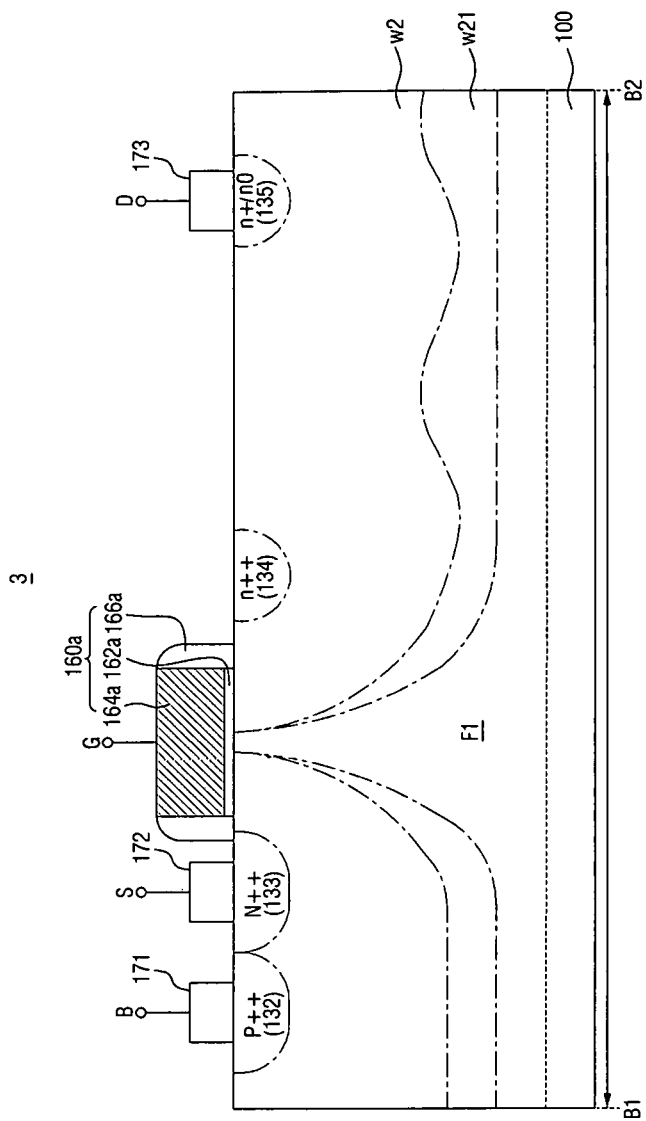
FIG. 7 is a cross-sectional view taken along the line B1-B2 of FIG. 6.

FIG. 6 is a layout diagram for explaining a semiconductor device according to an example embodiment of the present inventive concepts. FIG. 7 is a cross-sectional view taken along the line B1-B2 of FIG. 6. For convenience of explanation, the description of the parts substantially identical to the semiconductor devices according to example embodiments of the present inventive concepts will not be provided.

Referring to FIGS. 6 and 7, a semiconductor device 3 according to an example embodiment of the present inventive concepts may be formed and operated substantially in the same manner as the semiconductor device 1 according to an example embodiment of the present inventive concepts described above with reference to FIG. 2.

However, the semiconductor device 3 according to an example embodiment of the present inventive concepts may further include a sixth well 134. The sixth well 134 may be formed within the second well W2 and may be disposed so as to be spaced apart from the fourth well 135. Moreover, the sixth well 134 may have the same conductivity type as that of the fourth well 135. For example, when the conductivity type of the fourth well 135 is an N-type, the conductivity type of the sixth well 134 may be an N-type. However, the present inventive concepts are not limited thereto.

However, the impurity concentration of the sixth well 134 may be lower than the impurity concentration of the fourth well 135. That is, the sixth well 134 may include a lightly doped drain (LDD) region. By forming the sixth well 134, the lightly doped drain (LDD) region is formed at an intersection point between the gate structure 160a and the drift region, and thus, it is possible to have a structure capable of compensating for the low drift resistance. In particular, it is possible to compensate for the low drift resistance by forming the N-type LDD region.

Further, by forming the sixth well 134 by doping the impurities after forming the gate structure 160a, the sixth well 134 may be disposed so as not to overlap the gate structure 160a. However, the present inventive concepts are not limited thereto.

Figure 8:
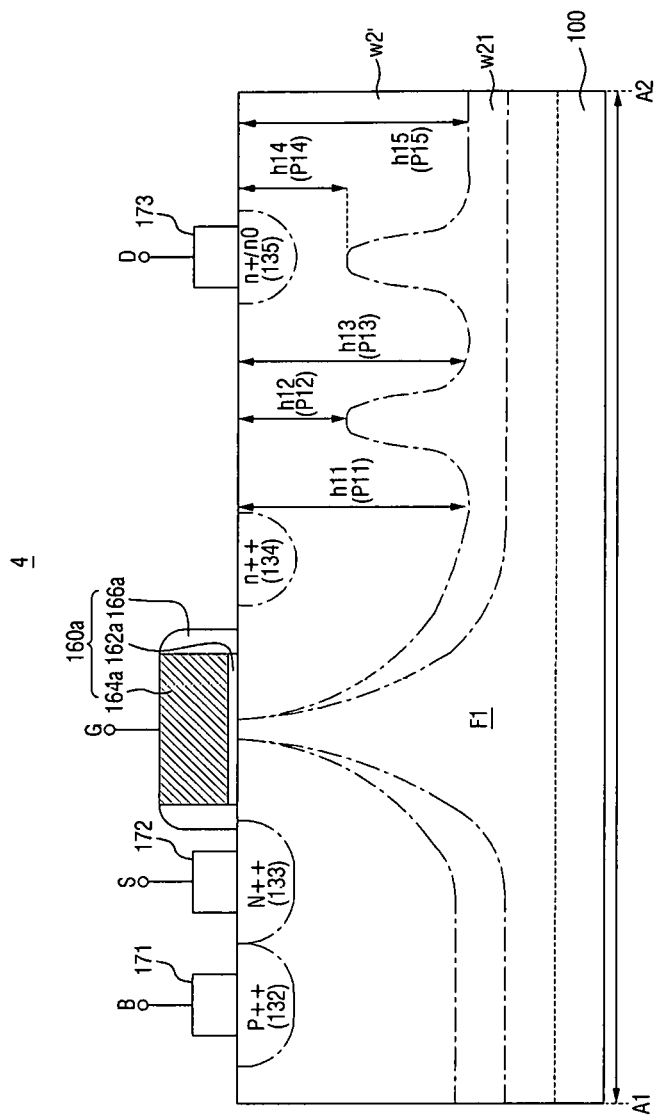
FIG. 8 is a cross-sectional view for explaining a semiconductor device according to an example embodiment of the present inventive concepts.

FIG. 8 is a cross-sectional view for explaining a semiconductor device according to an example embodiment of the present inventive concepts. For convenience of explanation, the description of the parts substantially identical to the semiconductor devices according to example embodiments of the present inventive concepts will not be provided.

Referring to FIG. 8, a semiconductor device 4 according to an example embodiment of the present inventive concepts may be formed and operated substantially in the same manner as the semiconductor device 2 according to an example embodiment of the present inventive concepts described above with reference to FIG. 4.

However, the semiconductor device 4 according to an example embodiment of the present inventive concepts may further include a sixth well 134. The sixth well 134 may be formed within the second well W2' and may be disposed so as to be spaced apart from the fourth well 135. Moreover, the sixth well 134 may have the same conductivity type as that of the fourth well 135. For example, when the conductivity type of the fourth well 135 is an N-type, the conductivity type of the sixth well 134 may be an N-type. However, the present inventive concepts are not limited thereto.

However, the impurity concentration of the sixth well 134 may be lower than the impurity concentration of the fourth well 135. That is, the sixth well 134 may include a lightly doped drain (LDD) region. By forming the sixth well 134, the lightly doped drain (LDD) region is formed at an intersection point between the gate structure 160a and the drift region, and thus, it is possible to have a structure capable of compensating for the low drift resistance. In particular, it is possible to compensate for the low drift resistance by forming the N-type LDD region.

Further, by forming the sixth well 134 by doping the impurities after forming the gate structure 160a, the sixth well 134 may be disposed so as not to overlap the gate structure 160a. However, the present inventive concepts are not limited thereto.

Figure 9:
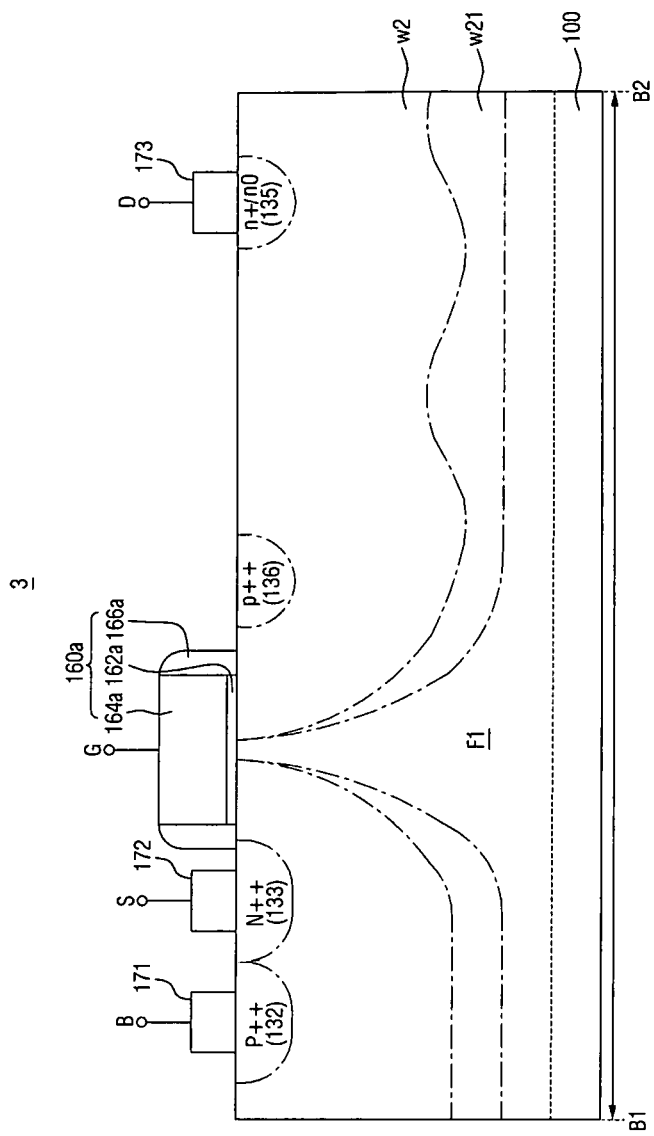
FIG. 9 is a cross-sectional view for explaining a semiconductor device according to an example embodiment of the present inventive concepts.

FIG. 9 is a cross-sectional view for explaining a semiconductor device according to an example embodiment of the present inventive concepts. For convenience of explanation, the description of the parts substantially identical to the semiconductor devices according to example embodiments of the present inventive concepts will not be provided.

Referring to FIG. 9, a semiconductor device 5 according to an example embodiment of the present inventive concepts may be formed and operated substantially in the same manner as the semiconductor device 1 according to an example embodiment of the present inventive concepts described above with reference to FIG. 2.

However, the semiconductor device 5 according to an example embodiment of the present inventive concepts may further include a seventh well 136. The seventh well 136 may be formed within the second well W2 and may be disposed so as to be spaced apart from the fourth well 135. Moreover, the seventh well 136 may have a conductivity type different from the fourth well 135. For example, when the conductivity type of the fourth well 135 is an N-type, the conductivity type of the seventh well 136 may be a P-type. However, the present inventive concepts are not limited thereto.

However, the impurity concentration of the seventh well 136 may be lower than the impurity concentration of the fourth well 135. That is, the seventh well 136 may include a lightly doped drain (LDD) region. By forming the seventh well 136, a P-type lightly doped drain (LDD) region is formed at an intersection point between the gate structure 160a and the drift region, and thus, a deep current path can be formed. Such structures may be used by being modified to have appropriate BVdss/Ion characteristics.

Further, by forming the seventh well 136 by doping the impurities after forming the gate structure 160a, the seventh well 136 may be disposed so as not to overlap the gate structure 160a. However, the present inventive concepts are not limited thereto.

Figure 10:
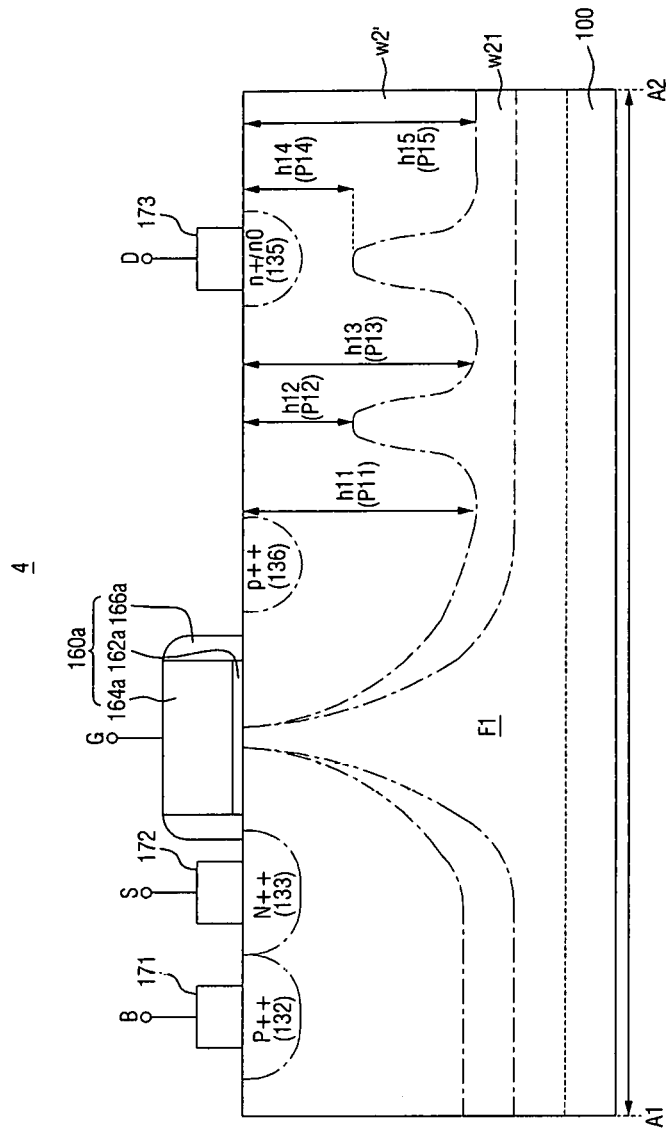
FIG. 10 is a cross-sectional view for explaining a semiconductor device according to an example embodiment of the present inventive concepts.

FIG. 10 is a cross-sectional view for explaining a semiconductor device according to an example embodiment of the present inventive concepts. For convenience of explanation, the description of the parts substantially identical to the semiconductor devices according to example embodiments of the present inventive concepts will not be provided.

Referring to FIG. 10, a semiconductor device 6 according to an example embodiment of the present inventive concepts may be formed and operated substantially in the same manner as the semiconductor device 2 according to an example embodiment of the present inventive concepts described above with reference to FIG. 4.

However, the semiconductor device 6 according to an example embodiment of the present inventive concepts may further include a seventh well 136. The seventh well 136 may be formed within the second well W2' and may be disposed so as to be spaced apart from the fourth well 135. Moreover, the seventh well 136 may have a conductivity type different from the fourth well 135. For example, when the conductivity type of the fourth well 135 is an N-type, the conductivity type of the seventh well 136 may be a P-type. However, the present inventive concepts are not limited thereto.

However, the impurity concentration of the seventh well 136 may be lower than the impurity concentration of the fourth well 135. That is, the seventh well 136 may include a lightly doped drain (LDD) region. By forming the seventh well 136, a P-type lightly doped drain (LDD) region is formed at an intersection point between the gate structure 160a and the drift region, and thus, a deep current path can be formed. Such structures may be used by being modified to have appropriate BVdss/Ion characteristics.

Further, by forming the seventh well 136 by doping the impurities after forming the gate structure 160a, the seventh well 136 may be disposed so as not to overlap the gate structure 160a. However, the present inventive concepts are not limited thereto.

A method of fabricating a semiconductor device according to some example embodiments of the present inventive concepts will be described below.

Figure 11:
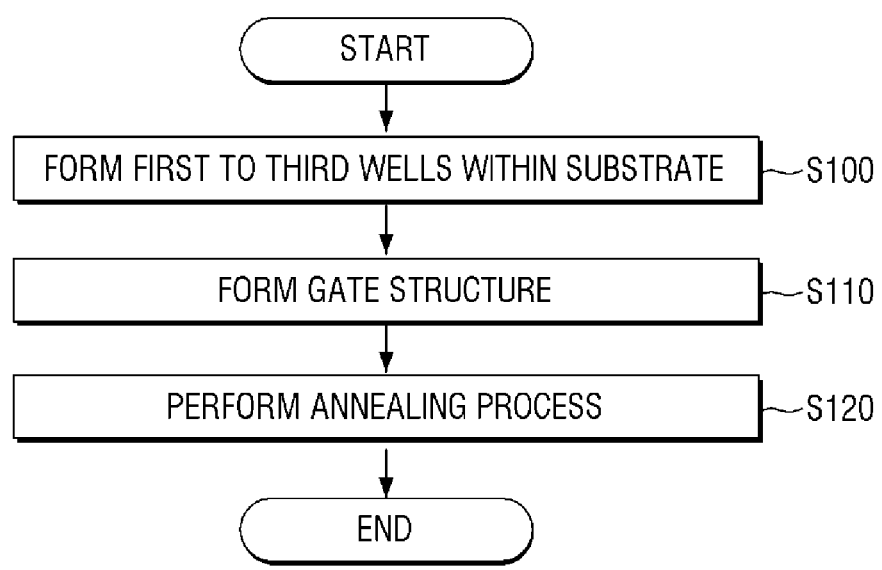
FIG. 11 is a flow chart sequentially illustrating a method of fabricating the semiconductor device according to an example embodiment of the present inventive concepts.

FIG. 11 is a flow chart sequentially illustrating a method of fabricating the semiconductor device according to an example embodiment of the present inventive concepts.

Referring to FIG. 11, in a method of fabricating a semiconductor device according to an example embodiment of the present inventive concepts, first, the first to third wells W31, W32, W33 are formed within the substrate 100 (S100).

The substrate 100 may be, for example, bulk silicon or silicon-on-insulator (SOI). Alternatively, the substrate 100 may be a silicon substrate and may contain other materials, for example, silicon germanium, indium antimonide, lead telluride, indium arsenide, indium phosphide, gallium arsenide or gallium antimonide.

Otherwise, the substrate 100 may be obtained by forming an epitaxial layer on a base substrate. In this case, the epitaxial layer may contain silicon or germanium as an elemental semiconductor material. Moreover, the epitaxial layer may include a compound semiconductor, and for example, may include a group IV-IV compound semiconductor or a group III-V compound semiconductor.

Specifically, taking the group IV-IV compound semiconductor as an example, the epitaxial layer may be a binary compound or a ternary compound containing at least two or more of carbon (C), silicon (Si), germanium (Ge) and tin (Sn), or a compound obtained by doping these elements with the group IV element.

Taking the group III-V compound semiconductor as an example, the epitaxial layer may be one of a binary compound, a ternary compound or a quaternary compound formed by binding at least one of aluminum (Al), gallium (Ga) and indium (In) as the group III element to one of phosphide (P), arsenic (As) and antimonium (Sb) as the group V element.

The first well W31 may contain the first conductivity type (e.g., P-type) impurities, the second well W32 may contain second conductivity type (e.g., N-type) impurities, and the third well W33 may contain second conductivity type (e.g., N-type) impurities.

Moreover, a gate structure TR is formed on the first well W31 and the second well W32 (S110).

The gate structure TR, for example, may be formed through the replacement process, but is not limited thereto.

Subsequently, impurities in the second well W32 and the third well W33 are diffused by performing the annealing process (S120). Thus, the side portions of the second well W32 and the third well W33 can form well regions having the low impurity concentration, and it is possible to fabricate a semiconductor device having a low drift resistance.

Figure 12:
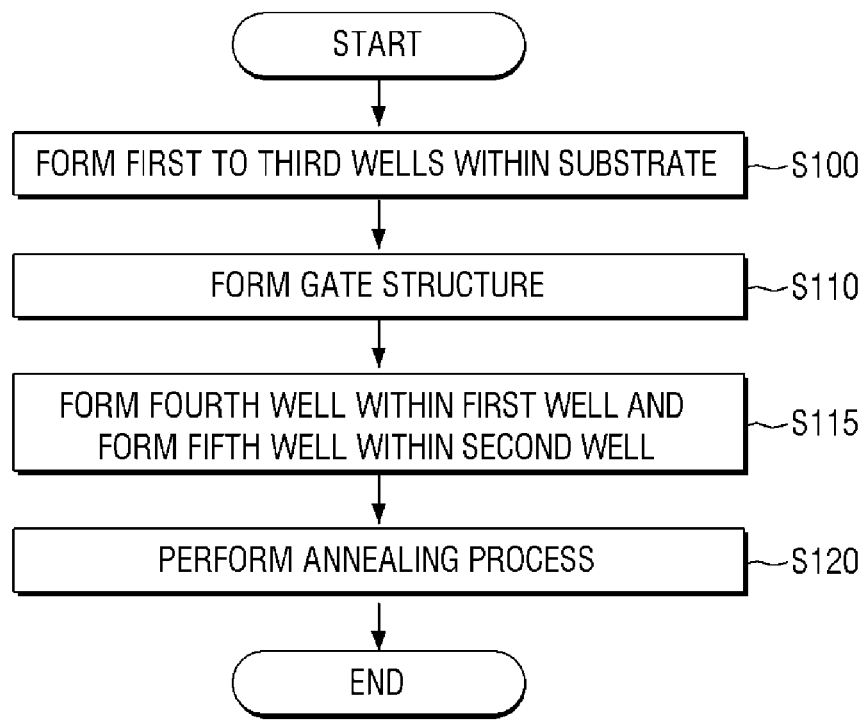
FIG. 12 is a flow chart sequentially illustrating a method of fabricating a semiconductor device according to an example embodiment of the present inventive concepts.

FIG. 12 is a flow chart sequentially illustrating a method of fabricating the semiconductor device according to another example embodiment of the present inventive concepts. For convenience of explanation, the description of the parts substantially identical to the description of the method of fabricating the semiconductor device according to an example embodiment of the present inventive concepts will not be provided.

Referring to FIG. 12, in a method of fabricating a semiconductor device according to another example embodiment of the present inventive concepts, first, first to third wells W31, W32, W33 are formed within the substrate 100 (S100). Moreover, a gate structure TR is formed on the first well W31 and the second well W32.

Subsequently, a fourth well W34 is formed within the first well W31, and a fifth well W35 is formed within the second well W32 (S115).

The fourth well W34 may be located on one side of the gate structure TR and may be formed within the first well W31. The fourth well W34 may have a conductivity type different from the first well W31. For example, when the conductivity type of the first well W31 is a P-type, the conductive type of the fourth well W34 may be an N-type. During operation of the semiconductor device according to an example embodiment, the fourth well W34, for example, may be used as a drain region.

The fifth well W35 may be located on the other side of the gate structure TR and may be formed within the second well W32. The fifth well W35 may have the same conductivity type as the second well W31. For example, when the conductivity type of the second well W32 is an N-type, the conductivity type of the fifth well W35 may be an N-type. During operation of the semiconductor device according to an example embodiment, the fifth well W35, for example, may be used as a source area.

Subsequently, impurities in the second well W32 and the third well W33 are diffused by performing the annealing process (S120). Thus, the side portions of the second well W32 and the third well W33 may form well regions having the low impurity concentration, and it is possible to fabricate a semiconductor device having a low drift resistance.

Figure 13:
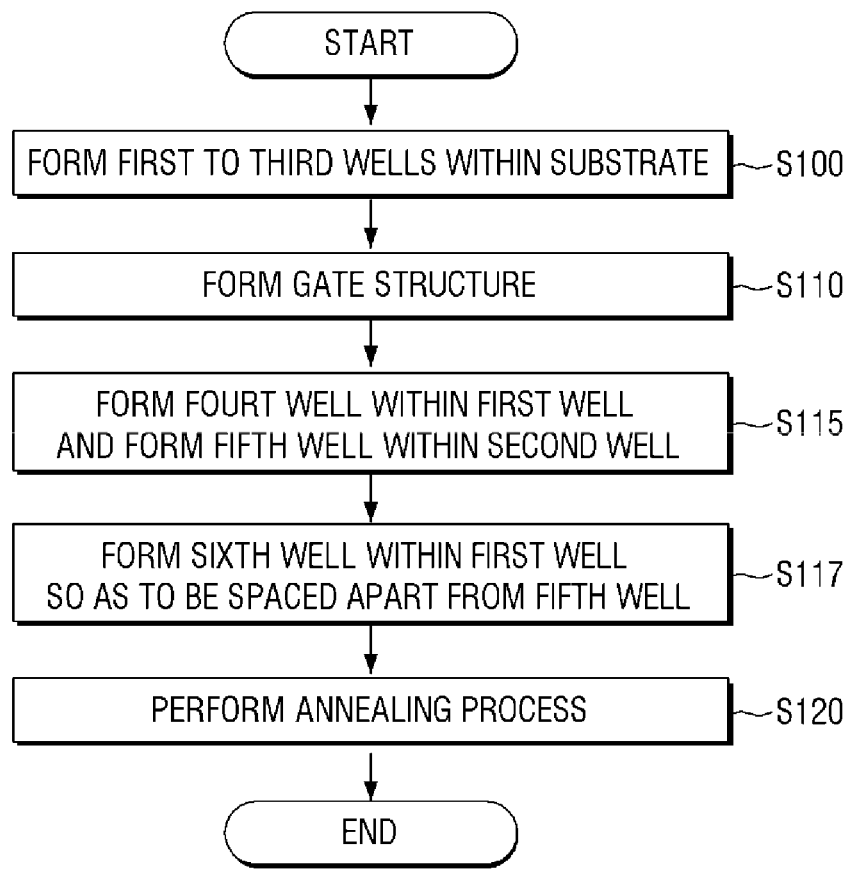
FIG. 13 is a flow chart sequentially illustrating a method of fabricating a semiconductor device according to an example embodiment of the present inventive concepts.

FIG. 13 is a flow chart sequentially illustrating a method of fabricating the semiconductor device according to another example embodiment of the present inventive concepts. For convenience of explanation, the description of the parts substantially identical to the description of the method of fabricating the semiconductor device according to some example embodiments of the present inventive concepts will not be provided.

Referring to FIG. 13, in a method of fabricating a semiconductor device according to another example embodiment of the present inventive concepts, first, the first to third wells W31, W32, W33 are formed within the substrate 100 (S100). Moreover, a gate structure TR is formed on the first well W31 and the second well W32. The fourth well W34 is formed within the first well W31 and the fifth well W35 is formed within the second well W32 (S115).

Subsequently, the sixth well W36 is formed within the second well W32 so as to be spaced apart from the fifth well W35 (S117).

The sixth well W36 may be formed within the second well W32 and may be disposed so as to be spaced apart from the fifth well W35. The sixth well W36 may have the same conductivity type as the fifth well W35. For example, when the conductivity type of the fifth well W35 is an N-type, the conductivity type of the sixth well W36 may be an N-type. However, the present inventive concepts are not limited thereto.

However, the impurity concentration of the sixth well W36 may be lower than the impurity concentration of the fifth well W35. That is, the sixth well W36 may include a lightly doped drain (LDD) region. By forming the sixth well W36, the lightly doped drain (LDD) region is formed at the intersection point between the gate structure TR and the drift region, and thus, it is possible to have a structure capable of compensating for the low drift resistance. In particular, it is possible to compensate for the low drift resistance by forming the N-type LDD region.

Further, by forming the sixth well W36 by doping the impurity after forming the gate structure TR, the sixth well W36 may be disposed so as not to overlap the gate structure TR.

Subsequently, impurities in the second well W32 and the third well W33 are diffused by performing the annealing process (S120). Thus, the side portions of the second well W32 and the third well W33 can form well regions having the low impurity concentration, and it is possible to fabricate a semiconductor device having a low drift resistance.

Figure 14:
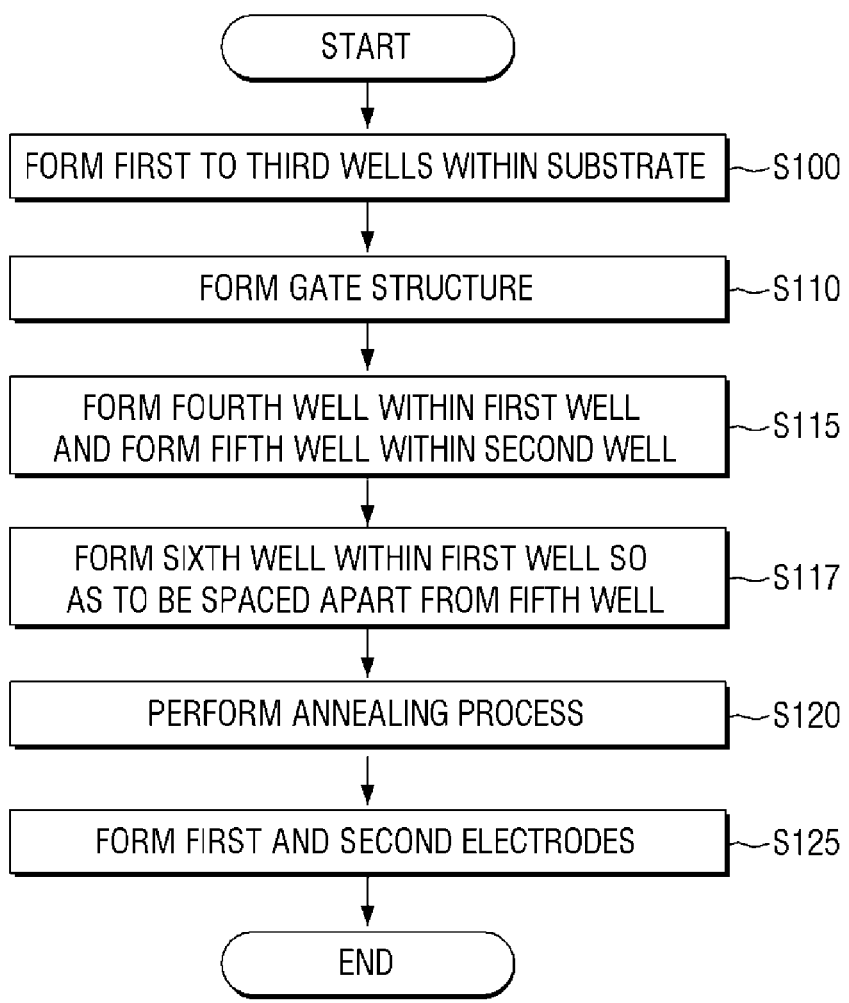
FIG. 14 is a flow chart sequentially illustrating a method of fabricating a semiconductor device according to an example embodiment of the present inventive concepts.

FIG. 14 is a flow chart sequentially illustrating a method of fabricating the semiconductor device according to another example embodiment of the present inventive concepts. For convenience of explanation, the description of the parts substantially identical to the description of the method of fabricating the semiconductor device according to some example embodiments of the present inventive concepts will not be provided.

Referring to FIG. 14, in a method of fabricating a semiconductor device according to another example embodiment of the present inventive concepts, first, the first to third wells W31, W32, W33 are formed within the substrate 100 (S100). The gate structure TR is formed on the first well W31 and the second well W32 (S110). The fourth well W34 is formed within the first well W31, and the fifth well W35 is formed within the second well W32 (S115). The sixth well W36 is formed within the second well W32 so as to be spaced apart from the fifth well W35 (S117). The impurities in the second well W32 and the third well W33 are diffused by performing the annealing process (S120).

Subsequently, a first electrode E1 electrode electrically connected to the fourth well W34 and a second electrode E2 electrically connected to the fifth well W35 are formed (S125).

The first electrode E1 may include a drain electrode, and the second electrode E2 may include a source electrode.

Figure 15:
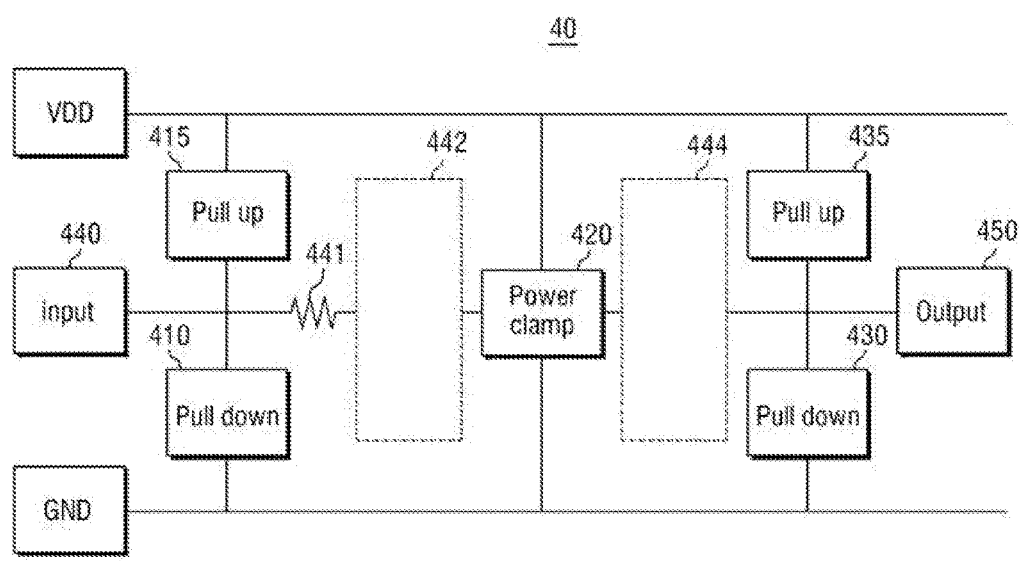
FIG. 15 is a block diagram illustrating an ESD protection circuit that includes the semiconductor device according to some example embodiments of the present inventive concepts.

FIG. 15 is a block diagram of an ESD protection circuit including a semiconductor device according to some example embodiments of the present inventive concepts.

Referring to FIG. 15, a semiconductor device 440 according to some example embodiments of the present inventive concepts includes ESD protection circuits 410, 415, 420, 430, 435, logic circuits 442, 444, an input port 440 and an output port 450.

The input port 440 may transmit the input signal to the logic circuits 442, 444 included in the semiconductor device, and the output port 450 may transmit the external signal, which is output from the logic circuits 442, 444, to the external device. Specifically, the signal that has entered through the input port 440 may be transmitted to the logic circuits 442, 444 through a resistor 441. The resistor 441 may serve as a buffer. However, the present inventive concepts are not limited thereto, and the resistor 441 may be omitted. The input port 440 may be connected to the input pad, and the output port 450 may be similarly connected to the output pad.

The logic circuits 442, 444 receive the provision of input signal applied to the input port 440 and may generate an output signal on the basis of the input signal. The logic circuits 442, 444 may include various transistors TR, resistors R and capacitors C. The logic circuits 442, 444 may generate a specific output for a specific input. For example, the logic circuits 442, 444 may perform the substantial operations desired by a user. The logic circuits 442, 444 may include a first logic circuit 442 and a second logic circuit 444, and the first logic circuit 442 and the second logic circuit 444 may be integrally formed.

The ESD protection circuit may include pull-up circuits 415, 435 pull-down circuits 410, 430, and a power clamp circuit 420. The semiconductor devices 1 to 6 according to some example embodiments of the present inventive concepts may be used in the pull-up circuits 415, 435, the pull-down circuits 410, 430 and the power clamp circuit 420.

The ESD protection circuit may adjust the level of the input signal, when the level of the input signal is out of a predetermined or desired range. For example, when the high-voltage input signal is temporarily applied, the ESD protection circuit may lower the voltage of the input signal. The predetermined or desired range corresponds to a range in which the logic circuits 442, 444 included in the semiconductor device can normally operate.

The pull-down circuits 410, 430 of the ESD protection circuit may include a gate-grounded NMOS (GGNMOS) transistor, and the pull-up circuits 415, 435 of the ESD protection circuit may include a gate-grounded PMOS (hereinafter, referred to as GGPMOS) transistor. A power clamp circuit 420 may include a gate-coupled NMOS (GCNMOS) transistor. However, the present inventive concepts are not limited thereto.

The pull-up circuits 415, 435 may be disposed between the input port 440 and the power supply VDD or between the output port 450 and the power supply VDD. The pull-down circuits 410, 430 may be disposed between the input port 440 and the ground GND or between the output port 450 and the ground GND. The power clamp circuit 420 may be disposed between the power supply VDD and the ground GND and may be connected to the logic circuits 442, 444.

Specifically, the pull-up circuits 415, 435 may receive a negative (−) ESD lower than the ground GND voltage from the input end 440 and may discharge it to the power supply VDD or to the ground GND through the power clamp circuit 420. Further, the pull-down circuits 410, 430 may receive a positive (+) ESD higher than the power supply VDD voltage and may discharge it to the ground GND or to the power supply VDD through the power clamp circuit 420. However, the present inventive concepts are not limited thereto.

Thus, the semiconductor device of the present inventive concepts can protect the logic circuits 442, 444 from ESD that is applied from the input port 440 through the ESD protection circuits 410, 415, 420, 430, 435. The arrangement of the power clamp circuit 420, the pull-up circuits 415, 435 and the pull-down circuits 410, 430 disposed between the logic circuit and the logic circuit is not limited to FIG. 15.

Figure 16:
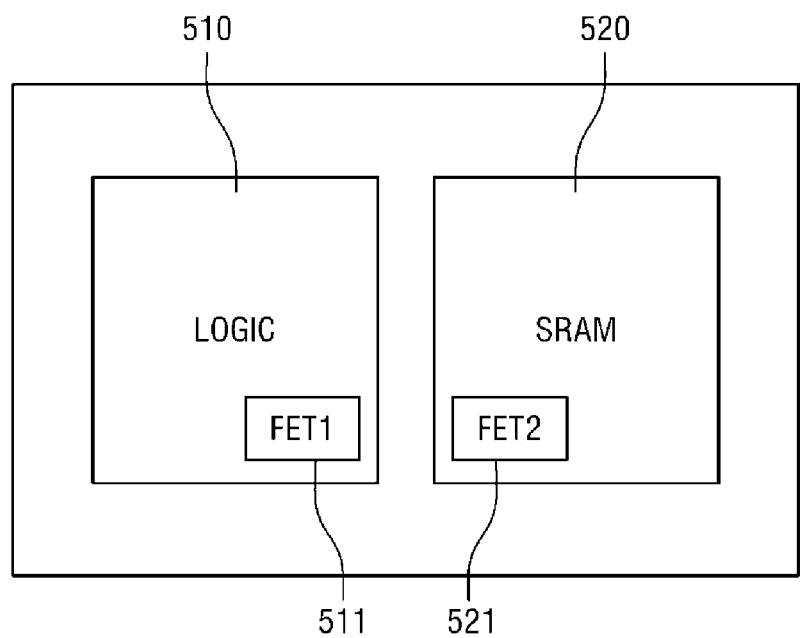
FIG. 16 is a diagram for explaining the semiconductor device according to some example embodiments of the present inventive concepts.
Figure 17:
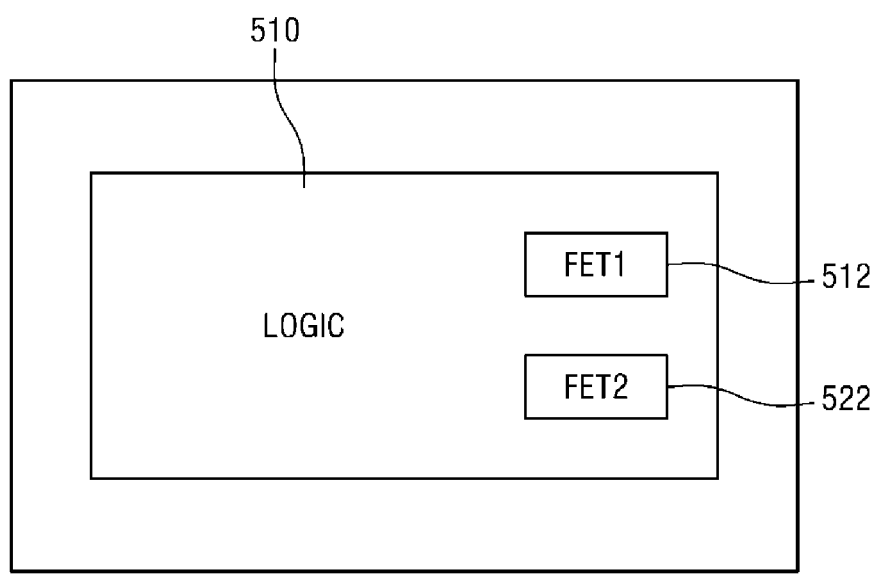
FIG. 17 is a diagram for explaining the semiconductor device according to some example embodiments of the present inventive concepts.

FIG. 16 is a diagram for explaining a semiconductor device according to some example embodiments of the present inventive concepts. FIG. 17 is a diagram for explaining a semiconductor device according to some example embodiments of the present inventive concepts. Differences from the above-mentioned example embodiments will be mainly described below.

Referring to FIG. 16, a semiconductor device 51 according to some example embodiments of the present inventive concepts may include a logic region 510 and a SRAM forming region 520. A first transistor 511 may be disposed in the logic region 510, and a second transistor 521 may be disposed in the SRAM forming region 520. FIG. 16 illustrates the logic region 510 and the SRAM forming region 520 as an example, but is not limited thereto. For example, the present inventive concepts can also be applied to the logic region 510 and a region (e.g., DRAM, MRAM, RRAM, PRAM or the like) in which another memory is formed.

Now, referring to FIG. 17, a semiconductor device 52 according to some example embodiments of the present inventive concepts may include a logic region 510, and third and the fourth transistors 412, 422 different from each other may be disposed within the logic region 510. Although it is not separately illustrated, the third and fourth transistors 412, 422 different from each other may be disposed within the SRAM region.

Here, the first transistor 511 may be one of the semiconductor devices 1 to 6 according to the example embodiments of the present inventive concepts, and the second transistor 521 may be another one of the semiconductor devices 1 to 6 according to the example embodiments of the present inventive concepts. For example, the first transistor 511 may be the semiconductor device 1 of FIG. 2, and the second transistor 521 may be the semiconductor device 2 of FIG. 4.

Meanwhile, the third transistor 412 may also be one of the semiconductor devices 1 to 6 according to the example embodiments of the present inventive concepts, and the fourth transistor 422 may also be another one of the semiconductor devices 1 to 6 according to the example embodiments of the present inventive concepts.

Figure 18:
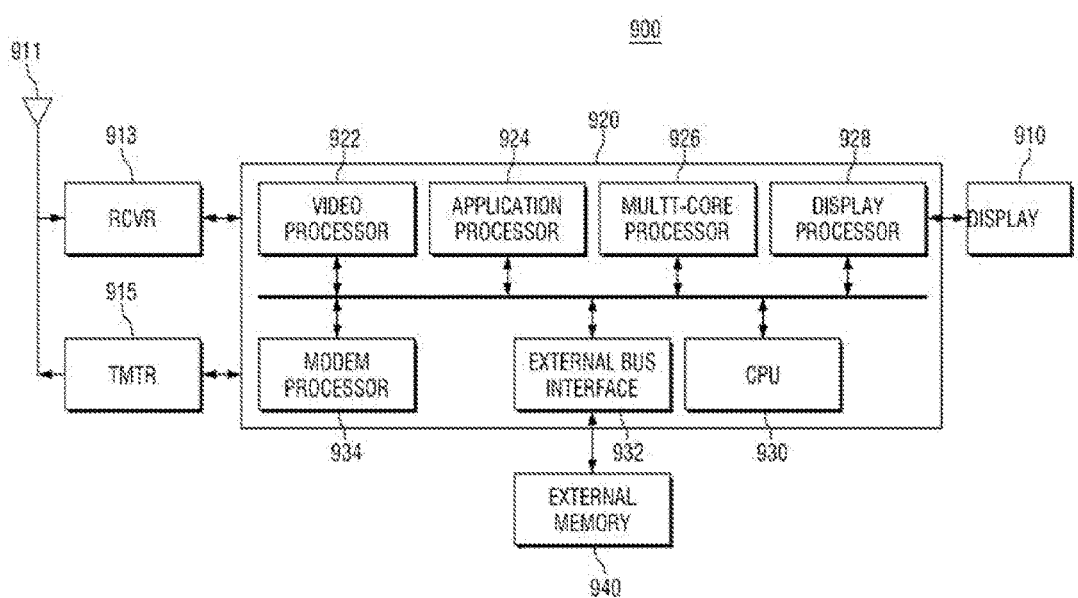
FIG. 18 is a block diagram illustrating a wireless communication device that includes the semiconductor device according to some example embodiments of the present inventive concepts.

FIG. 18 is a block diagram illustrating a wireless communication device that includes the semiconductor device according to the example embodiments of the present inventive concepts.

Referring to FIG. 18, a device 900 may be a cellular phone, a smart phone terminal, a handset, a personal digital assistant (PDA), a laptop computer, a video game unit, or other devices. The device 900 may use a code division multiple access (CDMA), a time division multiple access (TDMA) such as a global system (GSM) for mobile communication or other wireless communication standards.

The device 900 may provide a both-way communication through a reception route and a transmission route. Signals transmitted by one or more base stations on the reception route may be received by an antenna 911 and may be provided to a receiver (RCVR) 913. The receiver 913 may condition and digitize the received signal and may provide samples to the digital section 920 for additional processing. On the transmission route, a transmitter (TMTR) 915 receives the data transmitted from the digital section 920, processes and conditions the data and generates a modulated signal. The modulated signal may be transmitted to one or more base stations through the antenna 911.

The digital section 920 may be embodied as one or more digital signal processors DSP, micro-processors, reduced instruction set computers (RISC) or the like. The digital section 920 may be manufactured on one or more application specific integrated circuits (ASIC) or another type of integrated circuit (IC).

The digital section 920, for example, may include various processing and interface units, such as a modem processor 934, a video processor 922, an application processor 924, a display processor 928, a controller/multi-core processor 926, a central processing unit 930 and an external bus interface (EBI) 932.

The video processor 922 may perform the processing of the graphic applications. In general, the video processor 922 may include any number of processing units or modules for any set of graphic operations. Certain parts of the video processor 922 may be embodied as firmware and/or software. For example, the control unit may be embodied as firmware and/or software modules that perform the above-described functions (e.g., procedures, functions or the like). The firmware and/or software codes may be stored in a memory and may be performed by a processor (e.g., a multi-core processor 926). The memory may be embodied within the processor or may be embodied outside the processor.

The video processor 922 may embody the software interface, such as an open graphic library (OpenGL) and Direct3D. The central processing unit 930 and the video processor 922 may perform a series of graphic processing operations. The controller/multi-core processor 926 includes at least two cores, allocates the workload to the two cores according to the workload which needs to be processed by the controller/multi-core processor 926 and can simultaneously process the corresponding workload.

Although the application processor 924 is illustrated as one component included in the digital section 920 in the drawings, the present inventive concepts are not limited thereto. In some example embodiments of the present inventive concepts, the digital section 920 may be embodied by being integrated into a single application processor 924 or an application chip.

The modem processor 934 can perform the necessary operations during the data transfer process between the receiver 913, the transmitter 915 and the digital section 920.

The display processor 928 can perform the operations that are necessary for driving the display 910.

The semiconductor devices 1 to 6 according to the example embodiments of the present inventive concepts may be used as a cache memory, a buffer memory or the like used for calculation of the illustrated processors 922, 924, 926, 928, 930, 934.

Next, a computing system including the semiconductor device according to the example embodiments of the present inventive concepts will be described with reference to FIG. 19.

Figure 19:
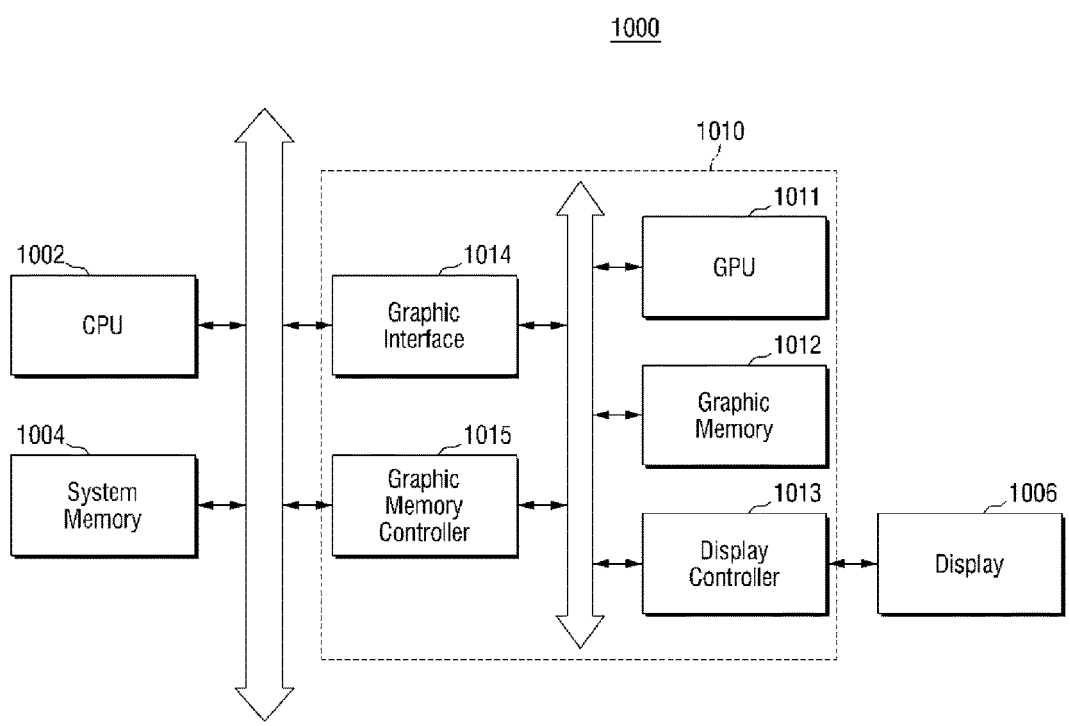
FIG. 19 is a block diagram of a computing system including the semiconductor device according to some example embodiments of the present inventive concepts.

FIG. 19 is a block diagram of a computing system including the semiconductor device according to the example embodiments of the present inventive concepts.

Referring to FIG. 19, a computing system 1000 according to an example embodiment of the present inventive concepts includes a central processing unit (CPU) 1002, a system memory 1004, a graphic system 1010 and a display device 1006.

The central processing unit 1002 may perform operations that are necessary for driving of the computing system 1000. The system memory 1004 may be configured to store data. The system memory 1004 may store data processed by the central processing unit 1002. The system memory 1004 may serve as an operation memory of the central processing unit 1002. The system memory 1004 may include one or more volatile memory devices, such as double data rate static DRAM (DDR SDRAM) and single data rate SDRAM (SDR SDRAM), and/or one or more nonvolatile memory devices, such as an electrically erasable programmable ROM (EEPROM) and a flash memory. One of the semiconductor devices 1 to 6 according to the example embodiments of the present inventive concepts may be adopted as a component of the system memory 1004.

The graphic system 1010 may include a graphic processing unit (GPU) 1011, a graphic memory 1012, a display controller 1013, a graphical interface 1014 and a graphic memory controller 1015.

The graphic processing unit 1011 may perform graphic operation processing that is necessary for the computing system 1000. Specifically, the graphic processing unit 1011 may assemble a primitive consisting of at least one vertex and may perform rendering, using the assembled primitives.

The graphic memory 1012 may store the graphic data processed by the graphic processing unit 1011 or may store the graphic data provided to the graphic processing unit 1011. Otherwise, the graphic memory 1012 may serve as an operation memory of the graphic processing unit 1011. One of the semiconductor devices 1 to 6 according to the example embodiments of the present inventive concepts may be adopted as a component of the graphic memory 1012.

The display controller 1013 may control the display device 1006 so that the rendered image frame can be displayed.

The graphical interface 1014 may perform interfacing between the central processing unit 1002 and the graphic processing unit 1011, and the graphic memory controller 1015 may provide a memory access between the system memory 1004 and the graphic processing unit 1011.

Although it is not clearly illustrated in FIG. 19, the computing system 1000 may further include one or more input devices, such as a button, a touch screen and a microphone, and/or one or more output devices, such as a speaker. Moreover, the computing system 1000 may further include an interface device for exchanging data with an external device by wired or wireless communication. The interface device, for example, may include an antenna, a wired and wireless transceiver or the like.

According to the example embodiments, the computing system 1000 may be any computing system, such as a mobile phone, a smart phone, a personal digital assistant (PDA), a desktop, a laptop computer and a tablet.

An electronic system including the semiconductor device according to the example embodiments of the present inventive concepts will be described below with reference to FIG. 20.

Figure 20:
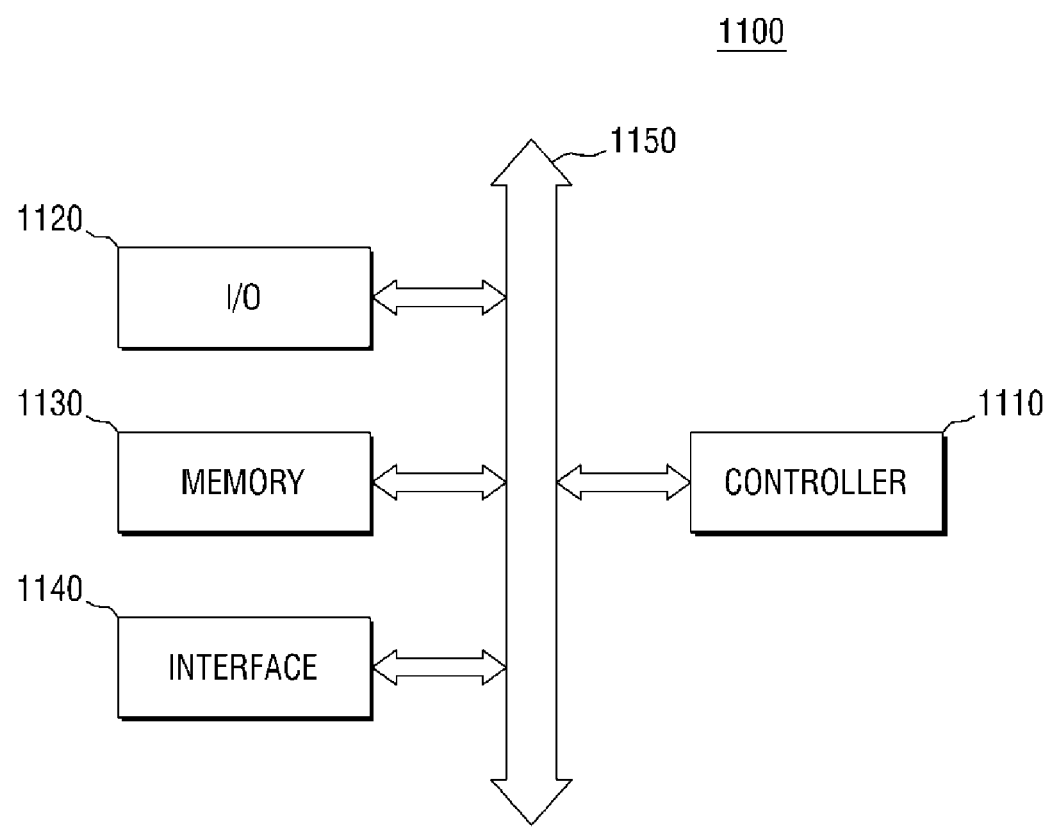
FIG. 20 is a block diagram of an electronic system including the semiconductor device according to some example embodiments of the present inventive concepts.

FIG. 20 is a block diagram of the electronic system including the semiconductor device according to the example embodiments of the present inventive concepts.

Referring to FIG. 20, an electronic system 1100 according to the example embodiment of the present inventive concepts may include a controller 1110, an input/output device (I/O) 1120, a memory device 1130, an interface 1140 and a bus 1150. The controller 1110, the input/output device 1120, the memory device 1130 and/or the interface 1140 may be coupled together through the bus 1150. The bus 1150 corresponds to a path through which the data are moved.

The controller 1110 may include at least one of a microprocessor, a digital signal process, a microcontroller and logic elements capable of performing the functions similar to these elements. The input/output device 1120 may include a keypad, a keyboard, a display device and the like. The memory device 1130 may store data and/or instruction words. The interface 1140 may perform the functions of transferring the data to the communication network or receiving the data from the communication network. The interface 1140 may be in a wired or wireless form. For example, the interface 1140 may include an antenna or a wired and wireless transceiver.

Although it is not illustrated, the electronic system 1100 may further include high-speed DRAM and/or SDRAM as an operation memory for improving the operation of the controller 1110. At this time, as such an operation memory, one of the semiconductor devices 1 to 6 according to the above-described example embodiments of the present inventive concepts may be adopted. Also, one of the semiconductor devices 1 to 6 according to the above-described example embodiments of the present inventive concepts may be provided in the memory device 1130 or may be provided as a part of the controller 1110, the input/output device (I/O) 1120 or the like.

The electronic system 1100 may be applied to a personal digital assistant (PDA), a portable computer, a web tablet, a wireless phone, a mobile phone, a digital music player, a memory card or all electronic products that can transmit and/or receive information in a wireless environment.

Figure 21:
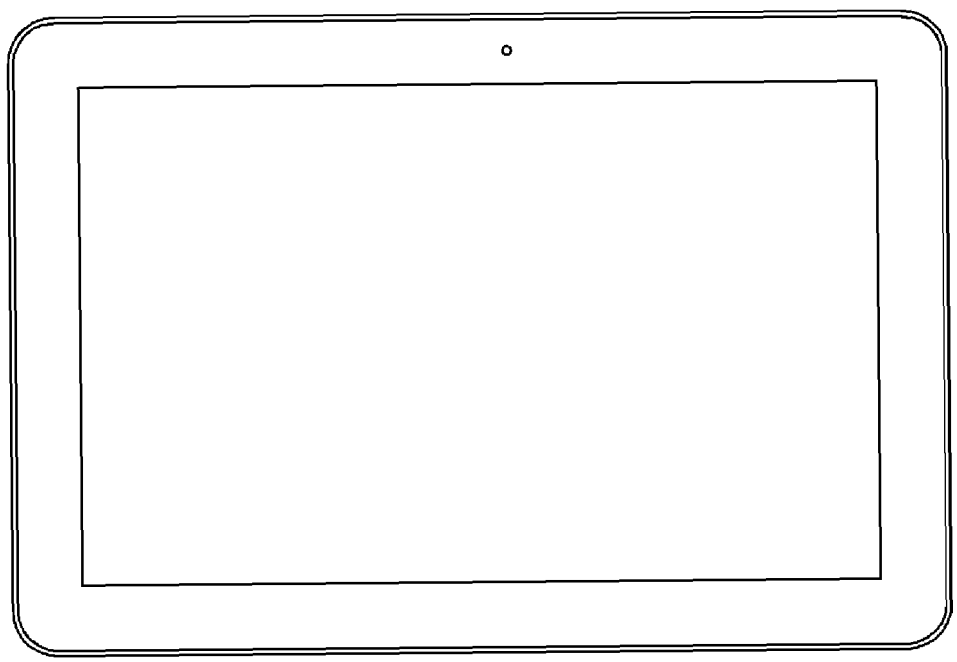
FIGS. 21 to 23 are example semiconductor systems to which the semiconductor devices according to some example embodiments of the present inventive concepts are applicable.
Figure 22:
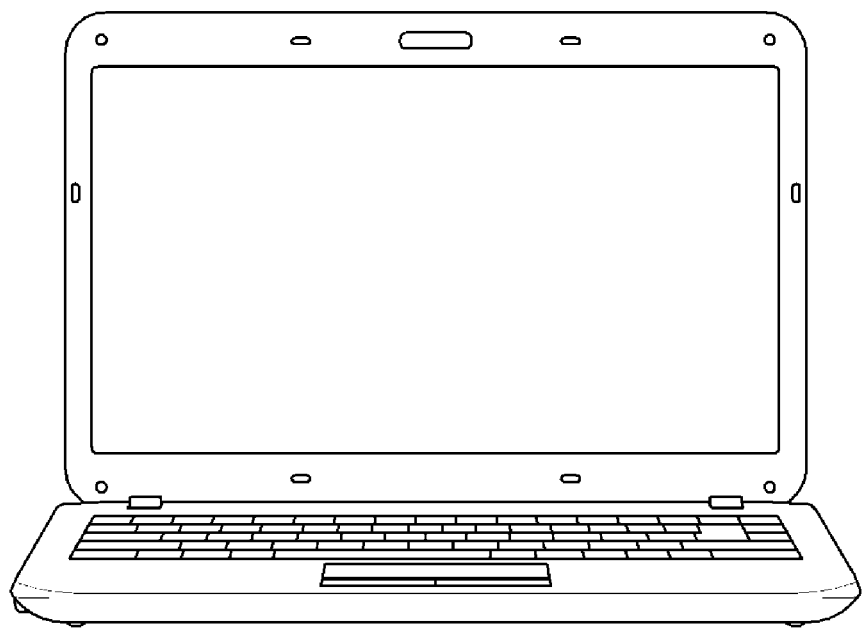
Figure 23:
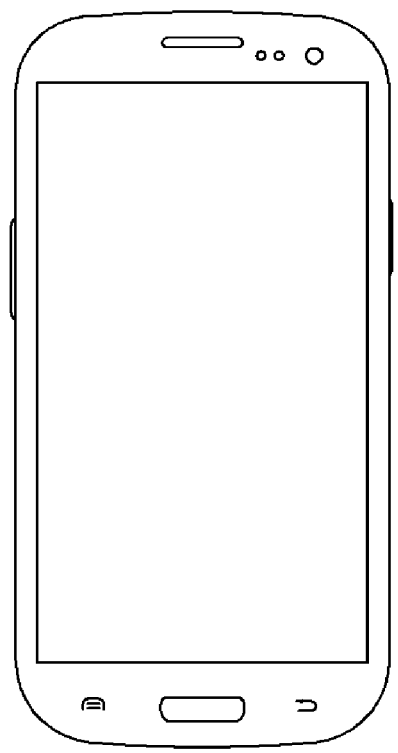

FIGS. 21 to 23 are example semiconductor systems to which the semiconductor devices according to the example embodiments of the present inventive concepts are applicable.

FIG. 21 is a diagram illustrating a tablet PC 1200, FIG. 22 is a diagram illustrating a laptop computer 1300, and FIG. 23 is a diagram illustrating a smart phone 1400. At least one of the semiconductor devices 1 to 6 according to the example embodiments of the present inventive concepts may be used for the tablet PC 1200, the laptop computer 1300, the smart phone 1400 or the like.

Further, it will be apparent to those skilled in the art that the semiconductor devices according to some example embodiments of the present inventive concepts are also applicable to other integrated circuit devices that are not illustrated. That is, although only the tablet PC 1200, the laptop computer 1300 and the smart phone 1400 are described above as an example of the semiconductor system according to this example embodiment, the examples of the semiconductor system according to this example embodiment are not limited thereto. In some example embodiments of the present inventive concepts, the semiconductor system may be achieved by a computer, an ultra mobile PC (UMPC), a workstation, a net-book, a personal digital assistant (PDA), a portable computer, a wireless phone, a mobile phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player or the like.

In concluding the detailed description, those skilled in the art will appreciate that many variations and modifications can be made to the preferred example embodiments without substantially departing from the principles of the present inventive concepts. Therefore, the disclosed preferred example embodiments of the inventive concepts are used in a generic and descriptive sense only and not for purposes of limitation.

While the present inventive concepts have been particularly shown and described with reference to example embodiments thereof, it will be understood by those of ordinary skill in the art that various changes in form and details may be made therein without departing from the spirit and scope of the present inventive concepts as defined by the following claims. It is therefore desired that the present example embodiments be considered in all respects as illustrative and not restrictive, reference being made to the appended claims rather than the foregoing description to indicate the scope of the inventive concepts.

What is claimed is:

1. A semiconductor device comprising:
   a first well in a substrate and including a first impurity of a first conductivity type;
   a second well in the substrate, including a second impurity of a second conductivity type different from the first conductivity type, and having first to third portions;
   an electrode on the second well and on a first surface of the substrate;
   a gate structure on the first well and the second well and on the first surface of the substrate; and
   a third well on one side of the gate structure in the substrate, and a fourth well on the other side of the gate structure in the substrate,
   wherein the third well is within the first well, and the fourth well is within the second well,
   the first to third portions are between the gate structure and the electrode,
   the second portion is between the first portion and the third portion, and
   the first portion and the third portion are deeper than the second portion.

2. The semiconductor device of claim 1, wherein a concentration of the second impurity of the first portion and the third portion is greater than a concentration of the second impurity of the second portion.

3. The semiconductor device of claim 1, wherein the third well and the fourth well are doped with the second impurity of the second conductivity type.

4. The semiconductor device of claim 1, further comprising:
   a fifth well within the second well and spaced apart from the fourth well.

5. The semiconductor device of claim 4, wherein the fifth well is doped with the second impurity of the second conductivity type.

6. The semiconductor device of claim 1, wherein the first well is spaced apart from the second well.

7. The semiconductor device of claim 1, wherein the gate structure does not overlap the second portion.

8. A semiconductor device comprising:
   a first well in a substrate and including a first impurity of a first conductivity type;
   a second well in the substrate, including a second impurity of a second conductivity type different from the first conductivity type, and having first to fifth portions, the first, third, and fifth portions having a concentration of the second impurity different from the second and fourth portions;
   a third well in the first well and including the second impurity;
   a fourth well in the second well and including the second impurity; and
   a gate structure on the first well and the second well,
   wherein the concentration of the second impurity of the first portion is greater than the concentration of the second impurity of the second portion,
   the first portion is deeper than the second portion and the fourth portion,
   the third portion is deeper than the second portion and the fourth portion, and
   the fifth portion is deeper than the second portion and the fourth portion.

9. The semiconductor device of claim 8, wherein the first well does not overlap the second well.

10. The semiconductor device of claim 9, further comprising:
    a first electrode electrically connected to the third well, and
    a second electrode electrically connected to the fourth well.

11. The semiconductor device of claim 10, wherein the first to third portions are between the gate structure and the second electrode.

12. The semiconductor device of claim 8, wherein the gate structure does not overlap the second portion.

* * * * *